United States Patent
Kitagawa et al.

(10) Patent No.: US 8,450,768 B2
(45) Date of Patent: *May 28, 2013

(54) SEMICONDUCTOR LIGHT-EMITTING ELEMENT AND PROCESS FOR PRODUCTION THEREOF

(75) Inventors: Ryota Kitagawa, Tokyo (JP); Koji Asakawa, Kawasaki (JP); Akira Fujimoto, Kawasaki (JP); Tsutomu Nakanishi, Tokyo (JP); Eishi Tsutsumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/335,984

(22) Filed: Dec. 23, 2011

(65) Prior Publication Data

US 2012/0091499 A1   Apr. 19, 2012

Related U.S. Application Data

(62) Division of application No. 12/363,198, filed on Jan. 30, 2009, now Pat. No. 8,101,964.

(30) Foreign Application Priority Data

Mar. 25, 2008 (JP) .................................. 2008-77421

(51) Int. Cl.
*H01L 33/00* (2010.01)

(52) U.S. Cl.
USPC 257/99; 257/98; 257/E33.065; 257/E51.019; 257/E23.015; 438/22; 438/666; 438/670; 438/676; 313/505

(58) Field of Classification Search
USPC ............... 257/99, 79, 98, E33.055, E33.062, 257/E33.065, E51.019, E23.001, E23.01, 257/E23.012, E23.015; 438/665, 22, 34, 438/36, 584, 666, 670, 686; 313/310, 505
See application file for complete search history.

(56) References Cited

U.S. PATENT DOCUMENTS 3,940,546 A    2/1976  Mercier et al.
5,153,889 A  * 10/1992  Sugawara et al. .......... 372/45.01

(Continued)

FOREIGN PATENT DOCUMENTS

JP   2004-55646    2/2004
JP   2005-209734   8/2005

(Continued)

OTHER PUBLICATIONS

Margalith et al., "Indium Tin Oxide Contacts to Gallium Nitride Optoelectronic Devices," Applied Physics Letters (1999), 74:3930-32.

(Continued)

*Primary Examiner* — Fernando L Toledo
*Assistant Examiner* — Victoria K Hall
(74) *Attorney, Agent, or Firm* — Finnegan, Henderson, Farabow, Garrett & Dunner, L.L.P.

(57) ABSTRACT

The present invention provides a semiconductor light-emitting element comprising an electrode part excellent in ohmic contact and capable of emitting light from the whole surface. An electrode layer placed on the light-extraction side comprises a metal part and plural openings. The metal part is so continuous that any pair of point-positions in the part is continuously connected without breaks, and the metal part in 95% or more of the whole area continues linearly without breaks by the openings in a straight distance of not more than ⅓ of the wavelength of light emitted from an active layer. The average opening diameter is of 10 nm to ⅓ of the wavelength of emitted light. The electrode layer has a thickness of 10 nm to 200 nm, and is in good ohmic contact with a semiconductor layer.

(A)

12 Claims, 2 Drawing Sheets

U.S. PATENT DOCUMENTS

| | | | |
|---|---|---|---|
| 6,258,618 B1 * | 7/2001 | Lester ........................... | 438/46 |
| 6,565,763 B1 | 5/2003 | Asakawa et al. | |
| 6,677,615 B2 * | 1/2004 | Takeuchi et al. ............... | 257/81 |
| 6,998,649 B2 | 2/2006 | Hata | |
| 7,394,107 B2 * | 7/2008 | Ohkawa ........................ | 257/98 |
| 8,039,864 B2 * | 10/2011 | Takao et al. ................... | 257/99 |
| 2002/0130605 A1 * | 9/2002 | Mueller et al. ................ | 313/310 |
| 2003/0047746 A1 * | 3/2003 | Kuniyasu et al. ............. | 257/103 |
| 2006/0097278 A1 | 5/2006 | Goto et al. | |
| 2009/0079322 A1 * | 3/2009 | Tsutsumi et al. ............. | 313/349 |
| 2011/0012150 A1 * | 1/2011 | Kim et al. ..................... | 257/98 |
| 2011/0012154 A1 * | 1/2011 | Okagawa et al. .............. | 257/98 |

FOREIGN PATENT DOCUMENTS

| | | |
|---|---|---|
| JP | 2005-279807 | 10/2005 |
| JP | 2006-294617 | 10/2006 |
| JP | 3940546 | 4/2007 |
| JP | 2009076361 A * | 4/2009 |

OTHER PUBLICATIONS

U.S. Appl. No. 12/236,132, filed Sep. 23, 2008, to Tsutsumi.

Notification of Reasons for Rejection issued by the Japanese Patent Office on Apr. 27, 2012, in Japanese Application No. 2008-077421.

Notification of Reason for Rejection issued by the Japanese Patent Office on Jan. 25, 2013, for Japanese Patent Application No. 2008-077421, and English-language translation thereof.

* cited by examiner (A)

(B)

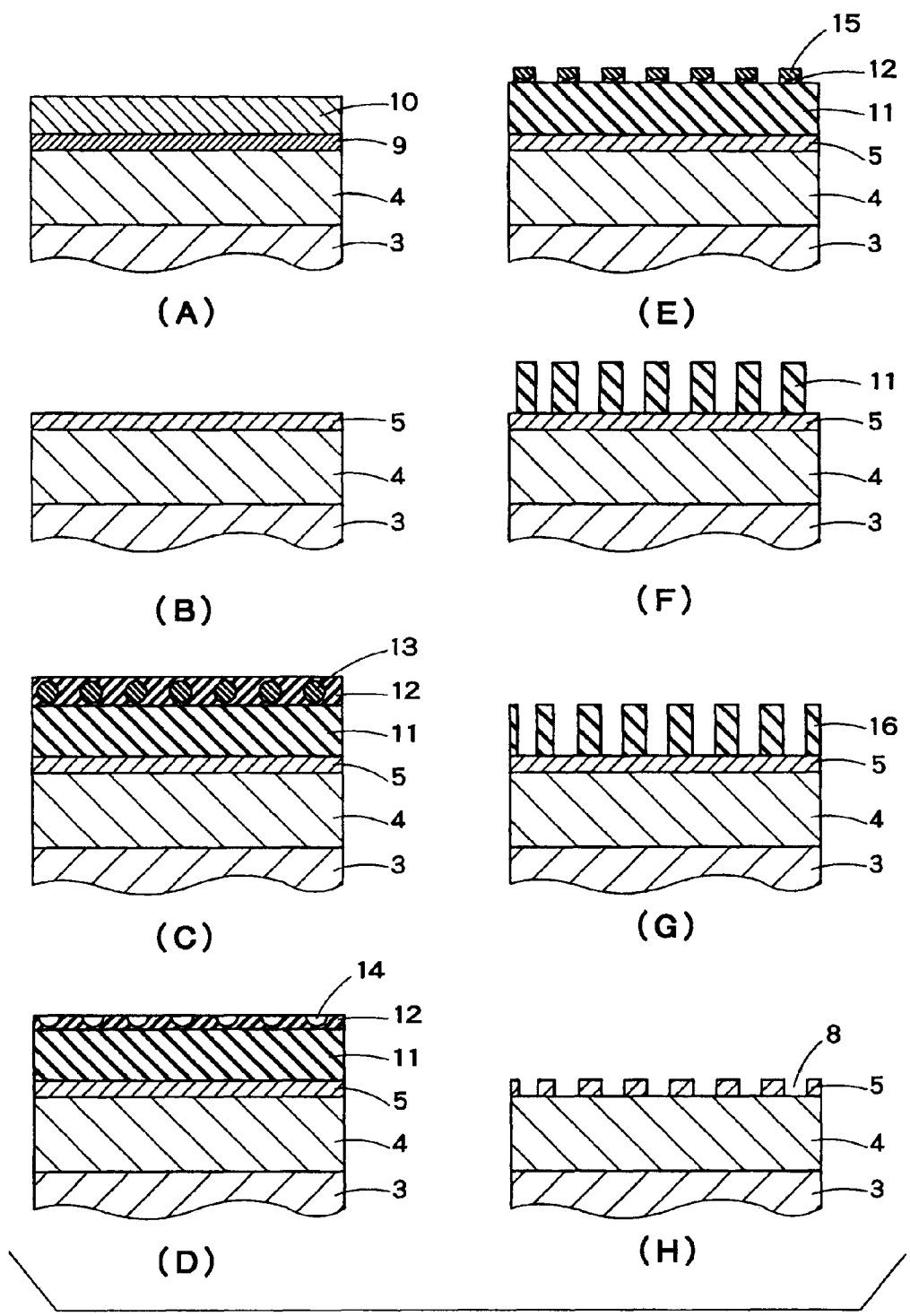
F I G. 2

SEMICONDUCTOR LIGHT-EMITTING ELEMENT AND PROCESS FOR PRODUCTION THEREOF

CROSS-REFERENCE TO RELATED APPLICATIONS

This is a division of application Ser. No. 12/363,198, filed Jan. 30, 2009, now U.S. Pat. No. 8,101,964 which is incorporated herein by reference.

This application is based upon and claims the benefit of priority from the prior Japanese Patent Applications No. 77421/2008, filed on Mar. 25, 2008; the entire contents of which are incorporated herein by reference.

BACKGROUND OF THE INVENTION

1. Field of the Invention

The present invention relates to a semiconductor light-emitting element comprising a light-transmitting metal electrode provided with fine openings, and also relates to a process for production thereof.

2. Background Art

A metal electrode is generally employed as an electrode provided on a semiconductor layer in a semiconductor light-emitting element. If produced from metals by the alloying process, the electrode is brought into such good ohmic contact with the semiconductor layer that a great deal of electric current can be injected into an active layer. Further, because of low contact resistance, the resultant device can work stably.

However, in the case where a metal electrode is adopted, a light-emitting area is small because the electric current flows only just under the electrode or near there. Further, it is also a problem that light emitted from the active layer is shaded by the opaque metal electrode. As a result, the light-extraction efficiency of the semiconductor light-emitting element is too lowered to give off a sufficient amount of emission. In order to solve the problem, there are proposed methods for enlarging the light-emitting area by incorporating fine wires into a pad-electrode and for expanding the electric current distribution by forming a current-spreading layer between the electrode and the semiconductor layer. However, they are yet to succeed in obtaining sufficient intensity of emission given off from the whole surface.

Recently, it has been studied to adopt an electrode structure in which a layer of transparent conductive oxide such as ITO and ZnO is formed on the light-extraction side-whole surface of the semiconductor layer and a metal pad-electrode is further formed thereon. In this method, it is possible to inject the electric current evenly and to extract out the light from the whole surface (see, JP-A 2005-209734 (KOKAI), for example).

However, in the electrode comprising the transparent conductive oxide, the semiconductor layer is in such poor ohmic contact with the electrode layer that the contact resistance is higher than that of the metal electrode (see, T. Margalith et. al., Appl. Phys. Lett. 74, 3930 (1999), for example). Further, it is also a problem that the transparent conductive oxide layer shows poorly adhesion to the metal electrode.

SUMMARY OF THE INVENTION

A semiconductor light-emitting element according to the present invention is characterized by comprising a crystal substrate, an electrode layer provided on one surface of said substrate, a semiconductor layer comprising an n-type semiconductor layer, an active layer and a p-type semiconductor layer superposed in the order on the other surface of said substrate, and a metal electrode layer which is provided on said semiconductor layer and which has a thickness in the range of 10 nm to 200 nm; wherein said metal electrode layer comprises:

a metal part so continuous that any pair of point-positions in said part is continuously connected without breaks, and plural openings which penetrate through said metal electrode layer and which have an average opening diameter of 10 nm to ⅓ of the wavelength of light emitted from said active layer, under the condition that said metal part in 90% or more of the whole area of said metal electrode layer continues linearly without breaks by said openings in a straight distance of not more than ⅓ of said wavelength of light.

Further, a process according to the present invention for production of the semiconductor light-emitting element is characterized by comprising the steps of:

forming a phase-separated block copolymer thin film in the form of a dot pattern of microdomains, and producing a metal electrode layer having openings by an etching process in which said dot pattern of microdomains is used as a mask.

Furthermore, another process according to the present invention for production of the semiconductor light-emitting element is characterized by comprising the steps of:

forming a metal electrode layer on said semiconductor layer, bringing said semiconductor layer into ohmic contact with said metal electrode layer by heat treatment, removing a part of said metal electrode layer by etching, forming a mask pattern on said metal electrode layer, and transferring said mask pattern by etching or by ion milling to form openings in said metal electrode layer.

The present invention provides a semiconductor light-emitting element comprising a metal electrode layer which is formed on the light-extraction side, which has high light-transparency and which is in good enough ohmic contact with the neighboring layer to have low contact resistance. The semiconductor light-emitting element has high external quantum efficiency, and hence can give off much brighter and much more intense emission than ever.

BRIEF DESCRIPTION OF THE DRAWINGS

FIG. 2 conceptually illustrates an example of the process for production of a semiconductor light-emitting element comprising a particular light-transmitting metal electrode according to one embodiment of the present invention.

DETAILED DESCRIPTION OF THE INVENTION

Figure 1:
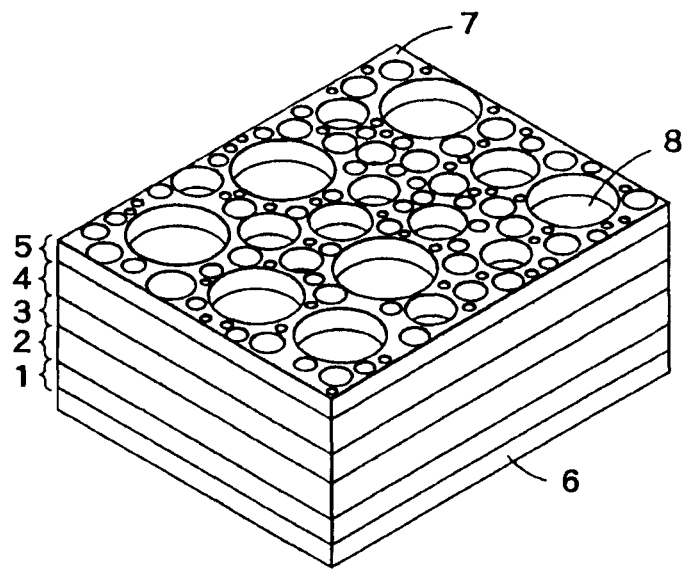
FIG. 1 schematically illustrates an example of the semiconductor light-emitting element comprising a p-type electrode provided with openings according to one embodiment of the present invention.
Figure 1:
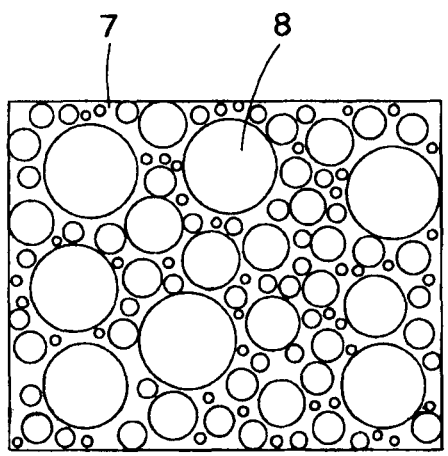

First, with respect to the response of substance irradiated by light, the basic theory is explained below.

Drude theory, which describes polarization by free electrons from the viewpoint of classical mechanics, tells us as follows. On the assumption that the mean scattering time of free electrons is much shorter than the period of oscillation of light, the dielectric function $\in(\omega)$ is expressed by the following formula (1):

$$\in(\omega) = \in_b(\omega) - \omega_p^2/\omega^2 \tag{1}$$

wherein $\omega_p{}^2 = ne^2/m \times \in_0$ is a plasma frequency of conduction electrons, and here n is a carrier density, e is an electric charge, m is an effective mass, and $\in_0$ is the permittivity of vacuum. The first term of the formula (1) stands for contribution of the metal dipoles, and is approx. 1, here. The second term stands for contribution of the conduction electrons.

As shown above, the plasma frequency is a function of the carrier density n. In the case of $\omega_p > \omega$, the dielectric function $\in(\omega)$ gives a negative value and hence the incident light undergoes plasma reflection. On the other hand, in the case of $\omega > \omega_p$, the dielectric function $\in(\omega)$ gives a positive value and hence the light penetrates through the substance. Accordingly, the plasma frequency can be regarded as the threshold between reflection and penetration when the substance responds to light.

A typical metal has a plasma frequency in the ultraviolet region, and hence reflects visible light. For example, silver Ag has a carrier density of $n=6.9 \times 10^{22}$ (cm$^{-3}$), and the wavelength corresponding to the plasma frequency is positioned at approx. 130 nm in the ultraviolet region.

In contrast, the wavelength corresponding to the plasma frequency of transparent conductive oxides, i.e. ITO, is positioned in the infrared wavelength region. The carrier density is in direct proportion to the electric conductivity and is in inverse proportion to the resistivity. This means that, if the dopant is increased to lower the resistivity, the plasma frequency is increased. Accordingly, when the dopant is increased to reach a particular amount, visible light in a longer wavelength region undergoes the plasma reflection to lower the transmittance.

As described above, in order that the conductive oxide material can ensure transparency in the visible region, the wavelength corresponding to the plasma frequency must be positioned in the infrared region. The carrier density, therefore, has an upper limit. For this reason, generally produced ITO has a carrier density of approx. $n=0.1 \times 10^{22}$ (cm$^{-3}$), which is several percents of those of metals. The lower limit of resistivity derived from the above value is approx. 100 $\mu\Omega\cdot$cm, and it is essentially impossible to reduce the resistivity more.

In consideration of the aforementioned problem, the present invention is thought out.

The semiconductor light-emitting element and the process for production thereof according to the present invention are explained below in detail with the attached drawings referred to.

FIG. 1 shows one embodiment of the light-emitting element according to the present invention. FIG. 1(A) is a sketch of the light-emitting element, and FIG. 1(B) is a top plane view thereof. As shown in FIG. 1(A), the light-emitting element of the present invention comprises a crystal substrate 1, an n-type semiconductor layer 2, an active layer 3 and a p-type semiconductor layer 4 superposed in the order. On the p-type semiconductor layer 4, a metal-made p-type electrode 5 characterized in the present invention is provided. Since the p-type electrode 5 is made of metal, an ohmic contact is formed between the p-type electrode 5 and the p-type semiconductor layer 4. On the opposite side, an n-type electrode 6 is provided under the crystal substrate 1. The p-type electrode 5 comprises a metal part 7 and fine openings 8 penetrating through the metal part. The p-type electrode 5 can function as an electrode and at the same time can transmit light emitted from the active layer.

The semiconductor light-emitting element according to the present invention is characterized in that the transparency is more than expected from the total area occupied by the openings 8 in the metal part 7, and in other words, is characterized in that the reflection essentially ascribed to the metal part 7 is fundamentally reduced to transmit light.

The above p-type electrode has openings much smaller than the wavelength of light emitted from the active layer, and thereby can serve as a light-transmitting electrode although made of a metal. There are roughly two reasons for this. One is that, when the electrode is exposed to light, movement of free electrons induced by the electric field of the light is inhibited since the metal part continues linearly without breaks by the openings in a straight distance of not more than ⅓ of the wavelength of light. Consequently, the electrode is transparent to the light. The other is that, since the openings have diameters much smaller than the wavelength of light, effects of Rayleigh scattering are reduced to keep straightforwardness of the light.

The first theoretical basis is then described below. The Drude theory described above is based on the assumption that the object substance is homogeneous and sufficiently large as compared with the wavelength of incident light. When light having a frequency lower than the plasma frequency is applied to the substance, free electrons in the substance are polarized by the electric field of the light. The polarization is induced in such direction that the electric field of light may be cancelled. The electric field of light is thus shielded by the induced polarization of electrons, so that the light does not penetrate into the substance and thus, what is called, "plasma reflection" is observed. If the substance in which polarization is induced by electrons is sufficiently small as compared with the wavelength of light, it is thought that the movement of electrons is restricted by the geometrical structure and, as a result, that the electric field of light cannot be shielded.

As described above, in the present invention, the response of substance to light is considered from the viewpoint of inhabitation of free electron movement by a hyperfine structure, and thereby the structure isotropically transmitting the electric field of light, as shown in FIG. 1, is proposed. The inventors have been studying that structure. As a result, it is found that the electrode comprising a metal part and openings, as a whole, can transmit all directions of polarized light if the metal part continues linearly without breaks by the openings in a straight distance of not more than ⅓, preferably not more than ⅕ of the wavelength of incident light. On the other hand, any pair of point-positions in the metal part is continuously connected. In other words, the metal part as a whole continues although the openings are provided therein, and thereby the function as an electrode is ensured while the resistivity is enough reduced, according to the volume ratio of the openings, to keep a relatively high electric conductivity.

It has been hitherto very difficult to produce completely evenly the above structure, in which the metal part continues linearly in a straight distance of not more than ⅓ of the wavelength of light, on the whole metal layer. However, the inventors have found that, only if 90% or more, preferably 95% or more of the whole metal layer has the structure in which the metal part continues linearly in a straight distance of not more than ⅓ of the wavelength of light, the transparency to light is ensured to achieve the object of the present invention.

The above description is based on the assumption that incident light comes perpendicularly to the surface of the electrode, but the light-transmitting metal electrode functions not only to perpendicularly incident light but also to obliquely incident light. Even in the case of obliquely incident light, the light also cannot penetrate into the metal although the movement of free electrons is geometrically inhibited in a longer apparent distance as compared with that in the case of perpendicularly incident light. When a metal is irradiated with light, the "skin-depth" is defined as the distance over which the penetrating light falls to 1/e (wherein "e" is a base of natural logarithms) of its original strength. The skin depth of obliquely incident light is only a few nanometers. Accordingly, even in the case of obliquely incident light, the light-transmitting metal electrode functions well.

For analyzing and confirming that the above structure is formed in the metal electrode layer, the following method can be adopted. A scanning electron or atomic force micrograph of the observed layer surface is subjected to Fourier transform, and the correlation wavelength and the correlation function are plotted on X- and Y-axes, respectively. The correlation function plotted on Y-axis indicates periodicity of the continuous structure. That is to say, it indicates how much the structure imaged in the micrograph contains moieties having the repeating unit of a particular wavelength. The threshold of the correlation wavelength is determined at $\frac{1}{3}$ of the wavelength of light, and then the integrated value of the correlation function in the range of more than the threshold and that in the whole wavelength region are calculated and compared. If the ratio of the former per the latter is 10% or less, it can be considered that 90% or more of the whole surface of the metal electrode layer continues linearly in a straight distance of not more than $\frac{1}{3}$ of the wavelength of light.

The second theoretical basis, which concerns the forward propagation of light maintained by reduction of scattering effects, is then described below.

The present invention is aimed to reduce scattering effects and thereby to improve the efficiency of the forward propagation of light, and hence it is necessary to treat sizes interacting with the incident light as parameters when the surface structure is defined. From this viewpoint, it is found that the diameter of the opening is most properly determined by the radius of gyration of the opening structure and thereby that the efficiency of the forward propagation of light can be most properly represented. That is to say, the radius of the opening in the surface structure according to the present invention is defined as its radius of gyration, and accordingly the diameter is double the radius of gyration. Even if the openings have different shapes, the same effect of the invention can be obtained as long as the radii of gyration are the same.

In the present invention, the radius of gyration of the opening is defined as follows. On an image of the opening, circular lines at equal intervals are drawn from the edge. In concrete, on a relief image obtained by an atomic force microscopy, circular lines at equal intervals are drawn from the edge. The thus-obtained lines are image-processed to obtain the center of gravity. The distance from the center of gravity to the concavity is then determined, and is processed together with the moment to calculate the radius of gyration R. The radius of gyration can be also obtained by Fourier transform of the electron or atomic force micrograph.

The larger the surface structure is, the more light is scattered. The effect of light-scattering is in proportion to the square of the size. Accordingly, the average radius of gyration R of the openings is preferably not more than $\frac{1}{6}$ of the wavelength of incident light. That is to say, the average diameter of the openings is preferably not more than $\frac{1}{3}$ of the wavelength of incident light. If the average radius of gyration R is larger than that, Rayleigh scattering is liable to occur and the light is immediately diffused. The diameter of the openings is more preferably not more than $\frac{1}{5}$, further preferably not more than $\frac{1}{10}$ of the wavelength of light. As long as the above conditions are satisfied, the shapes of the openings are not particularly restricted. Examples of the opening shapes include cylindrical shape, conical shape, triangular pyramidal shape, quadrilateral pyramidal shape, and other columnar or pyramidal shapes. Two or more shapes may be mixed. Even if the light-transmitting metal electrode according to the present invention contains various sizes of openings, the effect of the invention can be obtained. It is, on the contrary, rather preferred that the openings have various sizes because the metal part with those openings is apt to continue linearly in a relatively long straight distance. In the case like the above, where the openings have various sizes, the diameters of the openings can be represented by the average.

Preferably, the relative positions of the openings are arranged at random, namely, isotropically. According to the first theoretical basis, the reason for this can be explained as follows. For example, if the openings are arranged in hexagonal symmetry, the metal part has areas periodically continued in tri-axial directions and therefore cannot inhibit the movement of free electrons isotropically.

For analyzing and confirming whether the openings are arranged isotropically or not, the following method can be adopted. For example, an electron or atomic force micrograph of the metal layer having the openings is subjected to two-dimensional Fourier transform to obtain, what is called, a "reciprocal space image". If the relative arrangement of the openings has periodicity, there are clear spots in the reciprocal space image. In contrast, if the openings are relatively positioned isotropically in completely random arrangement, a ring is observed instead of the spots.

In the case where EB (electron beam) or other lithography system is used to form the openings, it is easy to produce a long-periodical structure having regular arrangement but it is difficult to produce a structure having the openings arranged randomly. On the other hand, in the present invention, a phase-separated pattern of block-copolymer is used as a template. The pattern of the phase-separated block copolymer gives openings relatively positioned isotropically in completely random arrangement, and hence is suitable for manufacturing the semiconductor light-emitting element according to the present invention.

The following description is based on the result that a semiconductor light-emitting element comprising a metal electrode provided with fine openings was produced and measured in practice.

In the present invention, it is necessary to produce a semiconductor light-emitting element comprising an electrode provided with a pattern having fineness beyond the resolution limit of generally performed lithography. Accordingly, it is preferred to adopt a nanofabrication method utilizing self-assembly of block copolymer. The pattern formation method utilizing self-assembly of block copolymer is disclosed in, for example, Japanese Patent No. 3940546, and is usable for producing the light-transmitting metal electrode in the present invention. The process according to the present invention can produce a large pattern having openings of 100 nm or less, which cannot be obtained according to conventional photo or electron beam lithographic processes. Needless to say, if the photo or electron beam lithographic processes are improved to produce the similar structure in the future, it can have the same function as the semiconductor light-emitting element according to the present invention.

In the present embodiment, a block copolymer mainly comprising aromatic polymer and acryl polymer in combination is used. As described below, however, the combination is not particularly restricted as long as one component of the block copolymer can be selectively removed. Further, the method in which nanoparticles are used as the template (JP-2005-279807 (KOKAI)), the in-printing process in which polymer having fine convexes and concaves is used as a stamp to transfer a relief image, and the EB (electron beam) lithographic system can be also adopted.

In order to use the block copolymer as a template in the present invention, the copolymer is required to form a self-assembled dot-shaped pattern in nano-scale. Accordingly, from the morphological viewpoint, it is most preferred that the block copolymer in bulk have dot-structures.

The inventors have found a method to obtain a block-copolymer in the phase-separated form of a dot pattern having a period of 50 to 70 nm. The dot pattern is transferred to the electrode by the process described below, to obtain a semiconductor light-emitting element comprising a light-transmitting metal electrode.

One example of the above process is explained below with FIG. 2 referred to.

First, on one surface of a crystal substrate, a semiconductor layer is formed. The semiconductor layer comprises an n-type semiconductor layer, a p-type semiconductor layer, and an active layer placed between them. For forming the semiconductor layer, generally a p-type or n-type semiconductor is first deposited on the substrate, and then an active layer is formed thereon. Finally, an n-type or p-type semiconductor is further deposited thereon. For example, an n-type semiconductor layer 2 is first formed on a crystal substrate 1, and then an active layer 3 is formed thereon and finally a p-type semiconductor layer 4 is formed on the active layer 3. Further, on the light-extraction side-surface of the p-type semiconductor layer 4, a metal thin film 9 and an alloy thin film 10 are deposited by the sputtering process or by the vacuum deposition process (FIG. 2(A)). The sample is then subjected to heat treatment to form an ohmic contact between the p-type semiconductor layer 4 and the metal thin film 9. There is no particular restriction on the heat treatment as long as the ohmic contact is formed. However, the heat treatment is preferably carried out at 200 to 500° C. for 10 to 120 minutes. Thereafter, if necessary, an upper part of the alloy thin film 10 is removed by ion milling or by dry etching to form a p-type electrode 5 before openings are formed therein (FIG. 2(B)). The thicker the electrode is, the lower the resistance is. On the other hand, the thinner the electrode is, the higher the light-transmittance is. The thickness of the electrode in the present invention is in the range of 10 nm to 200 nm.

If necessary, an organic polymer layer 11 is coated thereon. Successively, the sample is baked on a hot plate to evaporate the solvent, and then subjected to anneal treatment for curing in an oven. Finally, a part of the organic polymer layer 11 is lifted off to form a mask for processing the p-type electrode 5. Accordingly, the mask height depends upon the thickness of the organic polymer layer 11, and the organic polymer layer 11 preferably has a thickness of 50 to 400 nm.

Thereafter, a solution containing block copolymer is spin-coated on the organic polymer layer 11 to form a block copolymer layer. The sample is baked on a hot plate to evaporate the solvent, and then subjected to anneal treatment for phase-separation in an oven under nitrogen gas atmosphere. The anneal treatment is, for example, carried out preferably in the range of 150 to 300° C. The block copolymer used in the present embodiment comprises polystyrene (hereinafter, referred to as "PS") block and polymethyl methacrylate (hereinafter, referred to as "PMMA") block to form dots of PMMA 13 in a matrix of PS 12 (FIG. 2(C)).

Polystyrene (PS) and polymethyl methacrylate (PMMA) are much different in reactive ion etching (RIE) rate if proper gas species are employed. Accordingly, the dots of phase-separated PMMA can be selectively removed by RIE to form cavities 14. Thus, a mesh pattern of PS is obtained (FIG. 2(D)).

Typical polymers constituting the block copolymer normally have poor etching resistance compared to hard substance, e.g. semiconductor. To overcome this problem, the present embodiment adopts a pattern transfer method. In the method, the cavities 14 are filled with inorganic substance 15 by coating or by physical vapor deposition. A part of the PS mesh pattern is then removed by RIE to obtain a dot-pattern of the inorganic substance 15 (FIG. 2(E)).

Thereafter, the formed dot-pattern of the inorganic substance 15 is transferred by RIE onto the underlying organic polymer layer 11 to form a columnar pattern of the organic polymer layer (FIG. 2(F)). According to the lift-off process, the columnar pattern of the organic polymer layer is reversed to form a mask of mesh pattern 16 (FIG. 2(G)). The mask is preferably made of an inorganic substance having high etching selectivity against the organic polymer.

Finally, the mask of inorganic substance in the form of a mesh pattern 16 is transferred by ion milling or by etching onto the underlying p-type electrode, to form a p-type electrode 5 which has openings and which is in ohmic contact with the p-type semiconductor layer 4. Thus, a semiconductor light-emitting element comprising a light-transmitting metal electrode according to one embodiment of the present invention is produced (FIG. 2(H)).

The semiconductor light-emitting element of the present invention is not limited to that produced in the above procedures, and can be also obtained by the steps of, for example, forming openings in the electrode layer, performing heat treatment to form an ohmic contact, and removing an upper part of the electrode layer by ion milling or by etching. Those steps can be optionally combined to produce the element. Further, the electrode provided with openings can be formed on the upper surface of the semiconductor layer by the lift-off process without performing ion milling or etching, and then the heat treatment can be carried out to produce the element. If necessary, a pad-electrode can be provided on the electrode layer to increase current injection.

Materials employable in the present invention are described below in detail.

Examples of the materials for the semiconductor layer in the element of the present invention include GaP, InGaAlP, AlGaAs, GaAsP and nitride semiconductors. The layer can be formed by, for example, the metal organic chemical vapor deposition (MOCVD) method, the molecular beam epitaxy (MBE) method, or the vapor phase epitaxy (VPE) method. The crystal substrate is made of, for example, a material selected from the group consisting of gallium arsenide, sapphire, silicon, silicon nitride, silicon carbide, and zinc oxide.

In the structure of the semiconductor light-emitting element, the upper and lower electrodes are not limited to p-type and n-type, respectively. In contrast, the upper and lower electrodes may be n-type and p-type, respectively. If necessary, a buffer layer can be formed between the crystal substrate and the semiconductor layer. Further, a current-spreading layer and a contact layer can be formed between the electrode layer and the semiconductor layer. The structure of the active layer is not limited to a simple p-n junction structure, and may be any of known structures such as a double hetero (DH) structure, a single quantum well (SQW) structure and a multiple quantum well (MQW) structure.

The electrode layer of the light-emitting element according the present invention is made of a metal. If made of a metal, the electrode layer can be in ohmic contact with the semiconductor layer. The metal is preferably selected from the group consisting of Au, Ag, Al, Zn, Ge, Pt, Rd, Ni, Pd, Zr and alloys thereof. It is particularly preferred for the metal to have a plasma frequency higher than the frequency of light emitted from the active layer. The electrode layer may be a single layer or may have a multi-layered structure comprising superposed layers made of different metals.

In the present invention, organic polymers are used as a material of the mask pattern when the lift-off process is carried out for fabricating the light-transmitting metal electrode. After the pattern of inorganic substance is transferred, a mask of inorganic substance is formed with the organic polymer mask pattern. For the purpose of that, the organic polymers are preferably excellent in coatability and easily removed by an etchant or by ashing. Accordingly, the organic polymers preferably consist of organic substances only. Examples of the preferred organic polymers include polyhydroxylstyrene, novolac resin, polyimide, cycloolefin polymer, and copolymers thereof. Inorganic substances are used as a material of the mask when the organic polymer layer or the electrode layer is subjected to etching or milling. Accordingly, the inorganic substances preferably have etching resistance against oxygen plasma or argon ions. Examples of the inorganic substances include silicon, silicon nitride and silicon oxide. Those are sputtered or vapor-deposited to form a thin film. Further, spin-coated siloxene polymer, polysilane and spin-on glass (SOG) are also advantageous materials.

In the present embodiment, a block copolymer comprising an aromatic block and an acrylic block in combination is used. The reason of this is because these two blocks are much different in etching rate if proper gas species are employed. The basic theory of this is disclosed in U.S. Pat. No. 3,940,546. Examples of polymers constituting the aromatic block include PS, polyvinyl naphthalene, polyhydroxystyrene, and derivatives thereof. Examples of polymers constituting the acrylic block include polyalkylmethacrylates such as PMMA, polybutylmethacrylate and polyhexylmethacrylate; polyphenylmethacrylate, polycyclohexylmethacrylate and derivatives thereof. Instead of these methacrylates, acrylates can be used to obtain the same effects. Among the above, a block polymer of PS and PMMA is preferred because it can be easily synthesized and it is easy to control the molecular weight of each component polymer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Example 1

Firstly, a semiconductor light-emitting element comprising an active layer of InGaAlP in DH structure was produced.

The (100) face of n-type Si-doped GaAs was used as a crystal substrate. On the substrate, an n-type semiconductor layer (thickness: 1 μm) made of n-$In_{0.5}(Ga_{0.3}Al_{0.7})_{0.5}P$ doped with Si was formed by the MOCVD method from trimethylindium (hereinafter, referred to as "TMI"), trimethylgallium (hereinafter, referred to as "TMG"), trimethylaluminum (hereinafter, referred to as "TMA"), $PH_3$ and $Si_4$. Successively, an active layer of $In_{0.5}(Ga_{0.8}Al_{0.2})_{0.5}P$ having 0.6 μm thickness was formed thereon from TMI, TMG, TMA and $PH_3$, and then a p-type semiconductor layer (thickness: 1 μm) of p-$In_{0.5}(Ga_{0.3}Al_{0.7})_{0.5}P$ doped with Zn was produced from TMI, TMG, TMA, $PH_3$ and dimethylzinc (hereinafter, referred to as "DMZ"). Further, a current-spreading layer (thickness: 5 μm) of p-GaP doped with Zn was formed from TMG, $PH_3$ and DMZ.

Thereafter, on the whole bottom surface of the n-type GaAs substrate, an Au thin film (thickness: 50 nm) was vapor-deposited and then an AuGe-alloy thin film (thickness: 200 nm) was deposited thereon to form an n-type electrode layer. On the other hand, on the current-spreading layer, another Au thin film (thickness: 50 nm) and an AuZn-alloy thin film (thickness: 200 nm) were vapor-deposited in the order to form a p-type electrode layer. The obtained sample was subjected to heat treatment at 400° C. for 20 minutes under nitrogen gas atmosphere, to form ohmic contacts between the n-type electrode layer/the n-type GaAs substrate and between the p-GaP/the p-type electrode layer. An upper part of the p-type electrode layer was removed by milling with Ar-ion beams, so that the thickness of the p-type electrode layer was reduced to 50 nm.

The procedures for forming openings in the p-type electrode layer, which was placed on the light-extraction side, are described below in detail.

A thermosetting resist was diluted with ethyl lactate by 1:3. The solution was spin-coated on the top surface of the p-type electrode layer, and then heated on a hot-plate to evaporate the solvent. The sample was further heated at 250° C. for 1 hour under a nitrogen gas-atmosphere to perform a thermosetting reaction. The resist layer thus formed had a thickness of 100 nm.

Thereafter, PS-PMMA block copolymer diluted with propylene glycol monomethyl ether acetate (hereinafter, referred to as "PGMEA) and PMMA homopolymer diluted with PGMEA were mixed in a ratio of 6:4 by weight. The mixture was filtered through a 0.2 μm mesh to obtain a block copolymer solution.

The solution was spin-coated on the resist layer, and then heated on a hot-plate and further heated for phase-separation annealing in an oven under a nitrogen gas-atmosphere. As a result of the phase separation, the copolymer formed a pattern according to a morphology in which microdomains of PMMA in the form of dots having diameters of approx. 50 to 70 nm were dispersed in a matrix of PS. The thus-obtained block copolymer layer had a thickness of 60 nm.

The block copolymer layer was subjected to oxygen plasma RIE, to remove only the PMMA in the form of dots selectively. Thus, a PS mask of mesh pattern was obtained. Since PMMA was etched three times as fast as PS by the oxygen plasma RIE, PMMA was completely removed to leave the PS phase only.

Thereafter, spin-on glass (SOG) was diluted with ethyl lactate to prepare a 0.2% solution. The solution was then spin-coated on the PS mask of mesh pattern, so that the mesh holes were filled with SOG. The PS mesh and the resist layer thereunder were then selectively removed by oxygen plasma RIE, to form columns of the resist layer. Since SOG had higher etching resistance against the oxygen plasma RIE than PS and the resist, the resist layer covered with the SOG mask was protected while the area not covered was etched until the top surface of the p-type electrode layer was bared.

Successively, SOG was diluted with ethyl lactate to prepare a 12% solution, and was then spin-coated on the columnar resist layer to form a SOG layer (thickness: 500 nm). The SOG layer was then etched by $CF_4$ plasma to bare the top surface of the resist layer.

The columnar resist layer was removed by oxygen plasma RIE according to the lift-off method, to form a SOG mask of mesh pattern on the top surface of the p-type electrode layer. The SOG mask had a thickness of 100 nm.

The p-type electrode layer covered with the SOG mask of mesh pattern was then subjected to milling with argon-ion beams, to transfer the mesh pattern onto the p-type electrode layer. Finally, the remaining SOG mask was removed by RIE with $CF_4$ gas to form openings in the p-type electrode layer.

The p-type electrode layer in the thus produced element was provided with openings having an average diameter of 100 nm, and the openings occupied approx. 35% of the whole area. The metal part linearly continuing in 1/3 or less of the wave-length of light emitted from the active layer (approx. 210 nm or less) occupied approx. 98% of the whole area.

Then, the pad electrode was produced on the p-type electrode of the element by the following procedure. First, a photosensitive resist was coated on the p-type electrode, exposed to light by exposure apparatus, and developed to form a resist mask having openings of 100 μm diameter. On the resist mask, an Au thin film was deposited by the vapor-deposition process to be a thickness of 50 nm. Thereafter, the resist part was removed by oxygen plasma RIE to form a pad electrode having openings of 100 μm diameter. Thereafter, the sample was then cut into a chip of 350 μm square.

Comparative Example 1

A semiconductor light-emitting element having the same structure as that in Example 1, except that the p-type electrode layer consists of only a pad electrode of Au/AuZn, was produced as a comparative light-emitting element. The pad electrode was produced in the following manner. First, a photosensitive resist was coated on the current-spreading layer of p-GaP, exposed to light by exposure apparatus, and developed to form a resist mask having openings of 100 μm diameter. On the resist mask, an Au thin film and an AuZn alloy thin film were deposited by the vapor-deposition process to form a layered film of 50 nm thickness. Thereafter, the resist part was removed by oxygen plasma RIE to form a pad electrode having openings of 100 μm diameter. The sample was then subjected to heat treatment under nitrogen gas atmosphere to form an ohmic contact between the current-spreading layer and the electrode, and then cut into a chip of 350 μm square to produce a comparative semiconductor light-emitting element.

The performance of the semiconductor light-emitting element produced in Example 1 was evaluated by measuring and comparing emission thrown by the elements of Example 1 and Comparative Example 1 by means of a chip-tester. As a result, it was found that the element of Example 1 gave off as 1.4 times as intense emission as that of Comparative Example 1 did. The emitted light was extracted from the whole surface in Example 1, whereas the emitted light was extracted from the area near pad-electrode in Comparative Example 1.

Example 2

Secondly, a semiconductor light-emitting element comprising an active layer of InGaAlP in DH structure and an n-type semiconductor layer on the light-extraction side was produced.

On a p-GaAs substrate, a p-type semiconductor layer (thickness: 1 μm) of p-$In_{0.5}(Ga_{0.3}Al_{0.7})_{0.5}P$ doped with Zn was formed by the MOCVD method. Successively, an active layer of $In_{0.5}(Ga_{0.8}Al_{0.2})_{0.5}P$ having 0.6 μm thickness was formed, and then an n-type semiconductor layer (thickness: 1 μm) of n-$In_{0.5}(Ga_{0.3}Al_{0.7})_{0.5}P$ doped with Si was formed thereon. Further, a current-spreading layer (thickness: 5 μm) of n-GaP doped was formed thereon.

Thereafter, on the whole bottom surface of the p-GaAs substrate, an Au thin film (thickness: 50 nm) was vapor-deposited and then an AuZn-alloy thin film (thickness: 200 nm) was deposited thereon to form a p-type electrode layer. On the other hand, on the current-spreading layer, another Au thin film (thickness: 50 nm) and an AuGe-alloy thin film (thickness: 200 nm) were vapor-deposited in the order to form an n-type electrode layer. The obtained sample was subjected to heat treatment at 400° C. for 20 minutes under nitrogen gas atmosphere, to form ohmic contacts between the p-type electrode layer/the p-GaAs substrate and between the n-GaP/the n-type electrode layer. An upper part of the n-type electrode layer was removed by milling with Ar-ion beams, so that the thickness of the n-type electrode layer was reduced to 50 nm. Openings were then formed on the n-type electrode layer in the same manner as in Example 1. Then, a pad-electrode was provided on n-type electrode by the same procedure as Example 1, and the sample was cut into a chip of 350 μm square.

Comparative Example 2

A semiconductor light-emitting element having the same structure as that in Example 2, except that the n-type electrode layer was only a pad electrode of Au/AuGe, was produced by the procedure of Comparative Example 1 as a comparative light-emitting element.

The total emission of the semiconductor light-emitting element produced in the present example was measured and compared with that of the element produced in Comparative Example 2, to find that the present element gave off as 1.2 times as intense emission as that of Comparative Example 2 did.

Example 3

Thirdly, the procedures of Example 1 were repeated except that the ohmic contacts were formed after the openings were formed on the p-type electrode layer, to produce a semiconductor light-emitting element. The obtained element gave off as intense emission as that of Example 1 did. Further, in the produced element, the Zn-diffusion layer, which was formed by the ohmic contact between the p-type electrode layer and the p-type semiconductor layer, was continuously present only in the lower part of the p-type electrode layer.

The invention claimed is:

1. A semiconductor light-emitting element comprising a semiconductor layer comprising an n-type semiconductor layer, an active layer and a p-type semiconductor layer, and a metal electrode layer which is provided on said semiconductor layer; wherein
    said metal electrode layer comprises:
        a metal part so continuous that any pair of point-positions in said metal part is continuously connected without breaks, and
        plural openings which penetrate through said metal electrode layer and which have an average opening diameter of 10 nm to 1/3 of a wavelength of light emitted from said active layer, said openings being positioned in a whole area of said metal electrode layer, and said openings being positioned at random in said metal electrode layer, under the condition that said metal part in 90% or more of the whole area of said metal electrode layer continues linearly without breaks by said openings in a straight distance of not more than 1/3 of said wavelength of light.

2. The element according to claim 1, wherein the whole area of said metal electrode layer has a structure in which a distance over a region of said metal part between any two openings does not exceed ⅓ of said wavelength of light and wherein said distance between any two openings extends linearly in a straight line.

3. The element according to claim 1, wherein said metal electrode layer is provided on the n-type semiconductor layer.

4. The element according to claim 1, further comprises a substrate.

5. The element according to claim 1, further comprises another electrode layer.

6. The element according to claim 1, wherein said metal electrode layer has a thickness in the range of 10 nm to 200 nm.

7. The element according to claim 1, wherein said metal electrode layer is in ohmic contact with said semiconductor layer.

8. The element according to claim 1, wherein said metal electrode layer is made of a material having a plasma frequency higher than the frequency of light emitted from said active layer.

9. The element according to claim 1, wherein said metal electrode layer is provided on a current-spreading layer.

10. The element according to claim 1, wherein a pad-electrode is provided on said metal electrode.

11. The element according to claim 1, wherein said metal electrode layer is made of at least one metal selected from the group consisting of Au, Ag, Al, Zn, Ge, Pt, Rd, Ni, Pd, Zr and alloys thereof.

12. The element according to claim 1, wherein said average opening diameter is not larger than ⅕ of the wavelength of light emitted from said active layer.

* * * * *